US009635785B1

(12) United States Patent
Heydari et al.

(10) Patent No.: US 9,635,785 B1
(45) Date of Patent: Apr. 25, 2017

(54) LIQUID-ASSISTED BOTTOM AIR COOLING OF ELECTRONIC RACKS IN DATA CENTERS

(71) Applicants: Ali Heydari, Albany, CA (US); Eric Mahendra Kumar, San Leandro, CA (US); Charles J. Ingalz, Los Gatos, CA (US); Weiyu Lu, Fremont, CA (US); Tianyi Gao, Milpitas, CA (US); Manasa Sahini, Sunnyvale, CA (US); Yan Cui, San Jose, CA (US)

(72) Inventors: Ali Heydari, Albany, CA (US); Eric Mahendra Kumar, San Leandro, CA (US); Charles J. Ingalz, Los Gatos, CA (US); Weiyu Lu, Fremont, CA (US); Tianyi Gao, Milpitas, CA (US); Manasa Sahini, Sunnyvale, CA (US); Yan Cui, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 14/936,177

(22) Filed: Nov. 9, 2015

Related U.S. Application Data

(60) Provisional application No. 62/239,227, filed on Oct. 8, 2015.

(51) Int. Cl.
*G06F 1/16* (2006.01)
*H05K 5/00* (2006.01)
(Continued)

(52) U.S. Cl.
CPC ....... *H05K 7/20736* (2013.01); *H05K 7/2079* (2013.01)

(58) Field of Classification Search
CPC  G06F 1/20; G06F 1/203; G06F 1/206; H05K 7/20; H05K 7/20218; H05K 7/20254; H05K 7/20263; H05K 7/20272; H05K 7/20709; H05K 7/20763; H05K 7/20772; H05K 7/20781
(Continued)

(56) References Cited

U.S. PATENT DOCUMENTS 8,184,436 B2 * 5/2012 Campbell .......... H05K 7/20809
165/104.21
8,913,384 B2 * 12/2014 David .................... H05K 13/00
361/679.53
(Continued)

*Primary Examiner* — Anthony Haughton
(74) *Attorney, Agent, or Firm* — Blakely, Sokoloff, Taylor & Zafman LLP

(57) ABSTRACT

A data center system includes a container to contain electronic racks of IT components operating therein, a cooling unit disposed underneath the electronic racks to receive cool liquid from a chiller unit, to exchange heat generated from the IT components, and to transmit the hot liquid carrying the exchanged heat back to the chiller unit. Each electronic rack includes a housing to house IT components arranged in a stack, a first rack aisle formed on a first side of the IT components to direct cool air received from the cooling unit upwardly, and a second rack aisle formed on a second side of the IT components to direct hot air to the cooling unit downwardly, where the host air is transformed from the cool air from the first rack aisle by flowing through an air space between the IT components.

27 Claims, 14 Drawing Sheets

(51) Int. Cl.
*H05K 7/00* (2006.01)
*H05K 7/20* (2006.01)

(58) Field of Classification Search
USPC ......... 361/679.53, 679.47, 679.46, 724, 725, 361/726, 727, 699
See application file for complete search history.

(56) References Cited

U.S. PATENT DOCUMENTS

| | | | |
|---|---|---|---|
| 8,947,879 B2* | 2/2015 | Broome | H05K 7/1497 |
| | | | 165/104.33 |
| 2012/0279233 A1* | 11/2012 | Chainer | H05K 7/20781 |
| | | | 62/3.6 |
| 2015/0109728 A1* | 4/2015 | Campbell | H05K 7/20236 |
| | | | 361/679.47 |

* cited by examiner

LIQUID-ASSISTED BOTTOM AIR COOLING OF ELECTRONIC RACKS IN DATA CENTERS

RELATED APPLICATIONS

This application claims the benefit of U.S. provisional patent application No. 62/239,227, filed Oct. 8, 2015, which is incorporated by reference herein in its entirety.

FIELD OF THE INVENTION

Embodiments of the present invention relate generally to data centers. More particularly, embodiments of the invention relate to a liquid-assisted cooling system for cooling electronic racks of IT components in a data center.

BACKGROUND

Heat removal is a prominent factor in computer system and data center design. The number of information technology (IT) components such as servers deployed within a data center has steadily increased as the server performance has improved, thereby increasing the amount of heat generated during the ordinary operation of the servers. The reliability of servers used within a data center decreases if the environment in which they operate is permitted to increase in temperature over time. A significant portion of the data center's power is used for cooling electronics at the server level. As the number of servers within a data center increases, a greater portion of the power is commensurately consumed by the data center to cool electronic components within the servers.

In conventional data center structures, a computer room air conditioner (CRAC) circulates cold air throughout a data center. Conventionally, the CRAC is a closed-loop system that cools returning air drawn from within the data center and recirculates the cooled air to the servers within the data center. Because air drawn by the CRAC originates within the data center, the air has an increased temperature from cooling the servers in the data center. Certain conventional data centers utilize heat exchangers disposed on the top of electronic racks. However such a configuration may cause maintenance problems such as liquid leakage, which may damage the IT components or elements. Further, such a design is inefficient in a modular data center configuration.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1A:
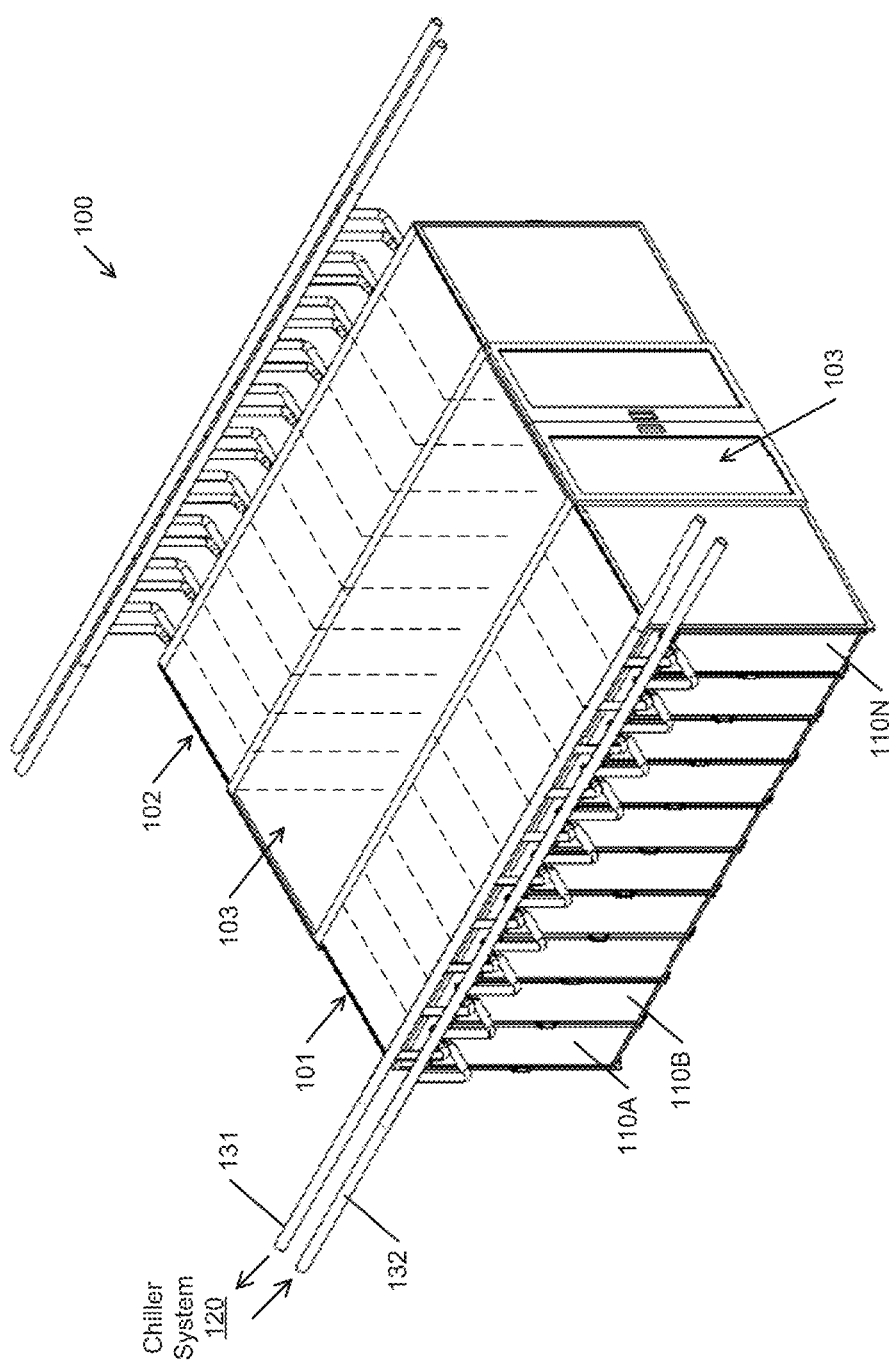
FIGS. 1A-1C are block diagrams illustrating a data center system according to one embodiment of the invention.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a cooling mechanism or cooling unit is provided to utilize liquid heat exchangers (as part of cooling units). The cooling units having liquid heat exchangers are placed underneath or below the electronic racks of IT components of a data center system, also referred to as a data center unit (e.g., a modular data center unit). A data center may include an array of one or more data center systems. The liquid exchangers are utilized for the purpose of cooling, reducing power utilization energy, and increasing the reliability of the data center hardware.

In one embodiment, liquid (e.g., water or dielectric liquid) pumped from a data center infrastructure chiller, data center condensing units, or any other means of achieving cooling liquid, is utilized for the purpose of cooling data center IT components by passing cooling liquid through heat exchangers located below IT components of the electronic racks in the data centers. The electronic racks are placed within an enclosure or container in a manner, such that rack cold and hot aisles are formed. There are fans located underneath of the racks to push returned air through the heat exchanger. The combination of the electronic racks, liquid heat exchangers located underneath, heat exchanger fans, and the outer enclosure of the electronic racks are considered to be the basic elements of a data center cooling system design.

In one embodiment, main elements of a data center cooling system include one or more electronic racks with IT components, cabling, power, and cooling aisles enclosed by an enclosure that act as cold and hot aisles of an electronic rack for the purpose of efficiently cooling the IT components. The cooling is achieved by passing cold liquid through a heat exchanger located underneath of an electronic rack. There are few auxiliary fans located adjacent to or within a proximity of the liquid heat exchanger that act as an assistant for pushing air through the heat exchanger. The electronic rack is located inside of a pod cluster (also referred to as a data center system or data center unit) along with several other electronic racks. Each electronic rack permits a certain amount of cooling air to be pushed into the rack cluster enclosure of the pod or container.

Figure 1B:
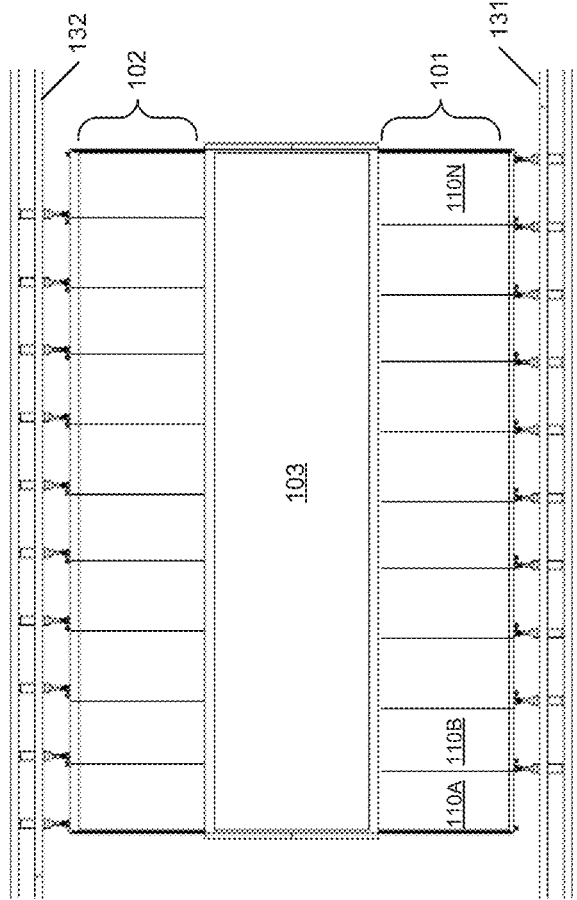
Figure 1C:
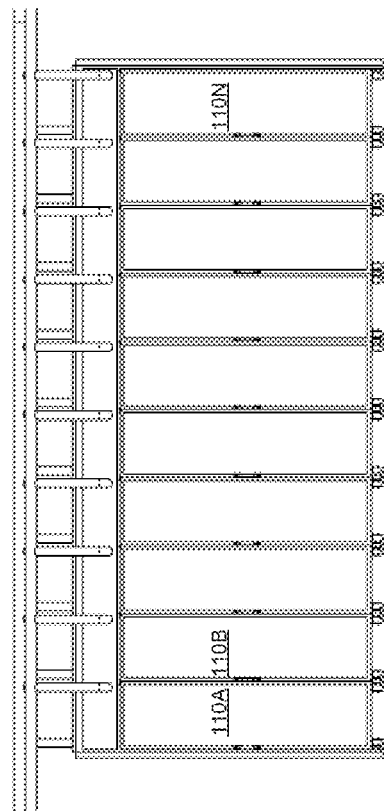

FIGS. 1A-1C are block diagrams illustrating a data center system according to one embodiment of the invention. In this example, a perspective view is shown in FIG. 1A. A cross-section view or side view of a data center system is shown in FIG. 1C while a top view of the data center system is shown in FIG. 1B. Data center system 100 is also referred to as a data center unit, where a typical data center may include one or more of data center units 100.

Referring to FIGS. 1A-1C, according to one embodiment, data center system 100 includes a housing structure, such as a room or a container, to house rows of electronic racks of IT components, equipment or instruments 101-102, such as, for example, computer servers that provide data services to a variety of clients. In this embodiment, data center system 100 includes electronic racks arranged in row 101 and row 102. However, more or fewer rows of electronic racks may be implemented. Row 101 is positioned aligned with a first wall or side of the container while row 102 is positioned aligned with a second wall or side of the container. The first and second walls or sides may be opposite walls or sides, which form a pod aisle 103 between row 101 and row 102 within the container.

Each of rows 101-102 includes an array of rack slots (e.g., vertical slots) to host electronic racks, such as electronic racks 110A to 110N. An electronic rack having a stack of IT components therein can slide in and out of a rack slot. Typically, an electronic rack includes a front penal and a back penal operating as front and back doors, which can be opened by an operator to perform management or maintenance actions. In one embodiment, a front panel of an electronic rack is positioned on a first side or first end away from pod aisle 103, while a back panel of the electronic rack is positioned on a second side or second end towards pod aisle 103. Typically, the front penal can be used to access the IT components, such as network connectors of the IT components, while the back penal is used to access one or more cooling fans mounted therein configured to blow cool air into an airspace between the IT components for the purpose of heat exchange. An IT personnel or operator can walk into pod aisle 103 to access the back panels of the electronic racks.

In one embodiment, a cooling unit having one or more heat exchangers (not shown) is disposed underneath or below the electronic racks of the IT components to receive first liquid (e.g., cold or cool liquid) from chiller system or chiller unit 120 via first liquid channel 131 (also referred to as a cold/cool liquid channel or supply line). The cooling unit is to exchange heat generated from the IT components using the first liquid, where the exchanged heat transforms the first liquid into second liquid having a higher temperature (e.g., hot or warm liquid). The cooling unit then transmits the second liquid back to chiller system 120 via liquid channel 132 (also referred to as a hot/warm liquid channel or supply line).

In one embodiment, each electronic rack, such as electronic racks 110A-110N, includes a housing (also referred to as a rack housing, rack enclosure, or rack container) to house the IT components in a stack. A first rack aisle (not shown) is formed between a first side of the stack of the IT components and a first wall of the housing. A second rack aisle (not shown) is formed between a second side of the stack and a second wall of the housing. The first rack aisle (also referred to as a rack cool aisle or RCA) is adapted to direct cool air received from a cooling unit, which is located underneath the corresponding electronic rack, upwardly to reach the IT components in the stack. The second rack aisle (also referred to as a rack hot aisle or RHA) is adapted to direct hot air to the cooling unit downwardly. The hot air is transformed from the cool air received from the first rack aisle by flowing through an airspace between the IT components in the stack. One of the advantages having a cooling unit at a position lower than the position of the electronic racks is that if the cooling unit fails to operate properly (e.g., liquid leakage), the IT components would not be damaged significantly.

Figure 2A:
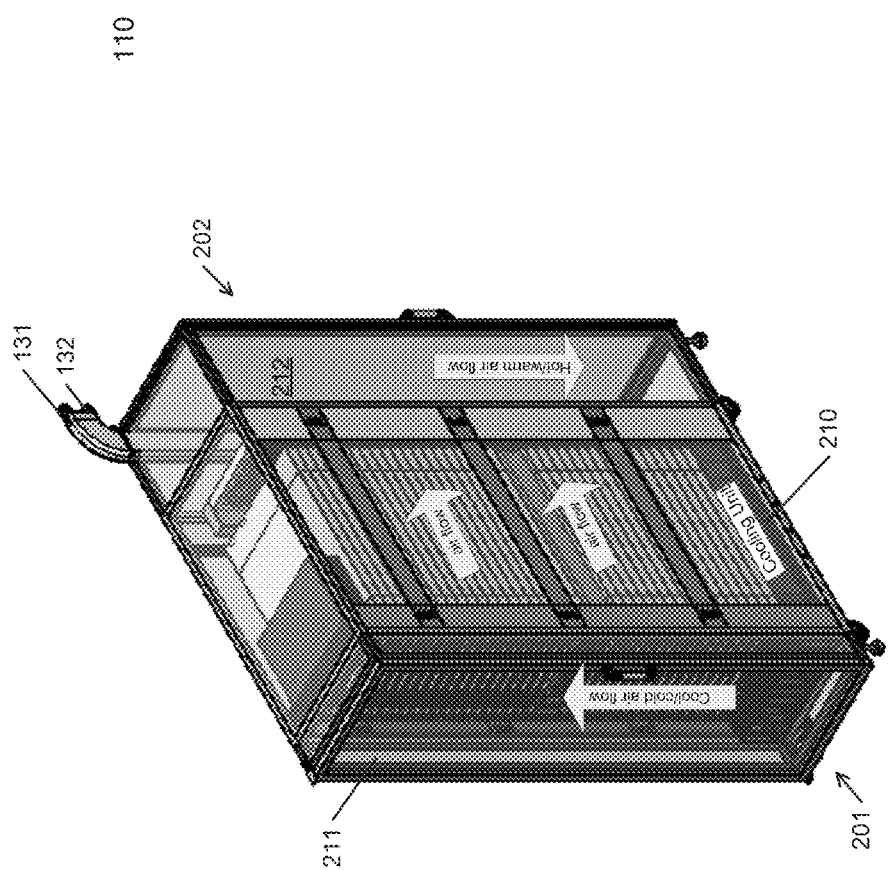
FIGS. 2A-2C are block diagrams illustrating a data center system according to another embodiment of the invention.
Figures 2B, 2C:
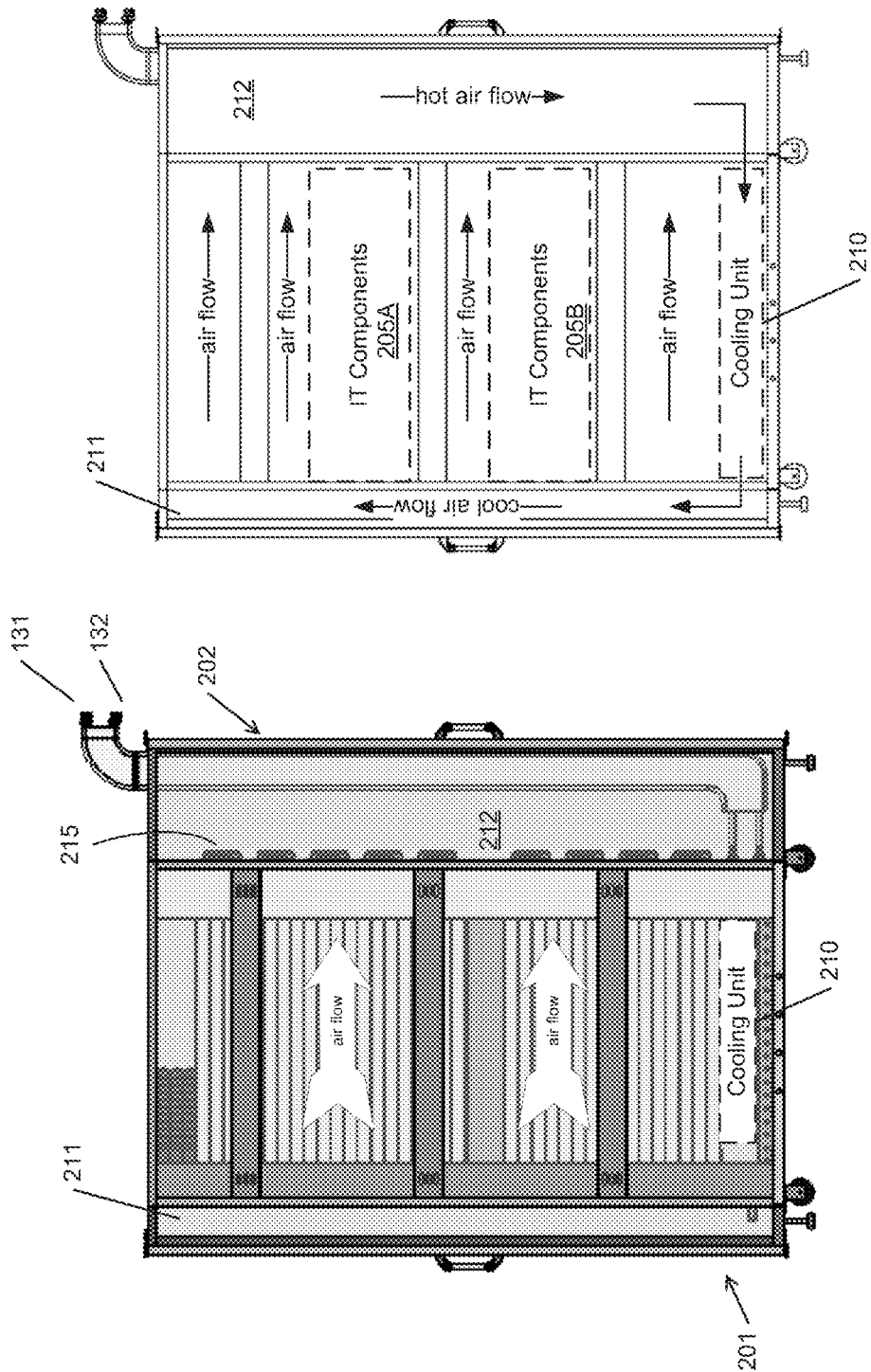

FIGS. 2A-2C are block diagrams illustrating an electronic rack according to one embodiment of the invention. In this example, FIG. 2A shows a perspective view of an electronic rack, while FIGS. 2B-2C show a side view or cross view of the electronic rack. Referring to FIG. 2A-2C, electronic rack 110 includes a rack housing having a front panel 201 and a back panel 202, which may operate as a front door or front window and a back door or back window, respectively. The rack housing is configured to house a stack of IT components 205A-205B. An IT component may operate as a server to provide data services to a variety of clients over a network. For example, an IT component may operate as a Web or cloud server, a storage server, an application server, a backend server, or any other appliance devices In one embodiment, the stack of IT components 205A-205B are positioned between front panel 201 and back panel 202 to form a front rack aisle 211 (e.g., first rack aisle) and a back rack aisle 212 (e.g., second rack aisle). In addition, a cooling unit 210 having at least one heat exchanger is disposed underneath or below IT components 205A-205B. As a result, even if there is leakage of liquid from a heat exchanger of cooling unit 210, it would not significantly damage IT components 205A-205B due to the leakage. In one embodiment, in addition to one or more heat exchangers, cooling unit 210 includes one or more fans or air propellers (not shown) to push cool air into front rack aisle 211 upwardly and to draw hot air from back rack aisle 212 downwardly into cooling unit 210. Front rack aisle 211 is also referred to as a rack cool aisle (RCA), while back rack aisle 212 is also referred to as a rack hot aisle (RHA).

Electronic rack 110 further includes one or more fans or air propellers 215 mounted on a side of IT components 205A-205B to direct cool air from rack aisle 211 flowing through the airspace between IT components 205A-205B into rack aisle 212. While flowing through the airspace between IT components 205A-205B, the cool air exchanges with the heat generated from IT components 205A-205B to transform or become hot or warm air in rack aisle 212. That is, due to the heat exchange, the airflow flowing into rack aisle 212 has a temperature higher than the temperature of the airflow received in rack aisle 211. Such a heat exchange of an airflow leads to a temperature reduction of IT components 205A-205B.

Note that electronic rack 110 may represent any of electronic racks 110A-110N as shown in FIGS. 1A-1C. Also note that the configuration as shown in FIGS. 2A-2C are described for the purpose of illustration only. Other configurations may also be applied. For example, a front side or front panel may be configured as a back side or back panel, or vice versa in another configuration. Further, fans 215 may be mounted on the other side of the IT components, as long as they can direct the cool air travelling through the airspace between the IT components.

Figure 3A:
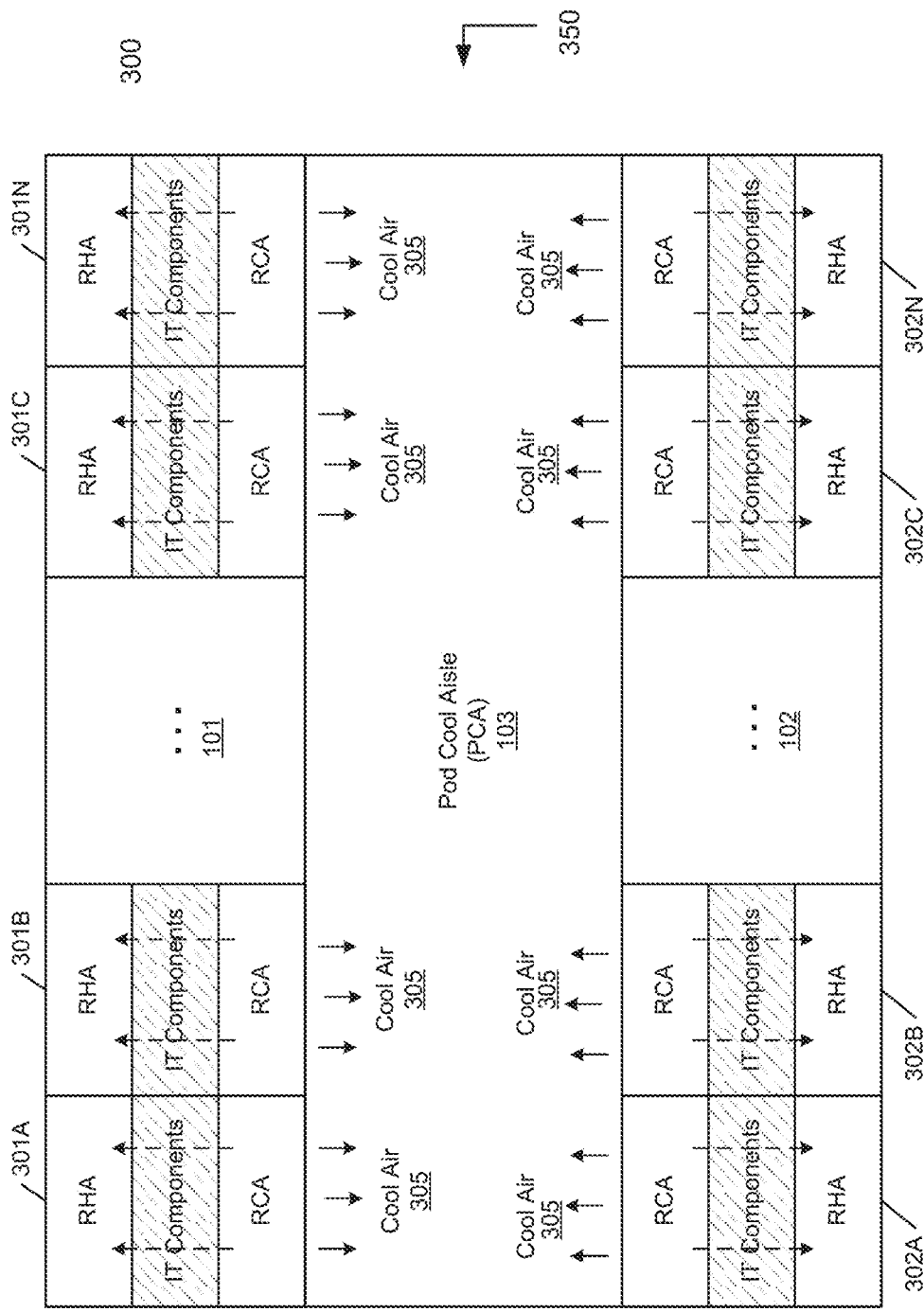
FIGS. 3A-3B are block diagrams illustrating a data center system according to another embodiment of the invention.
Figure 3B:
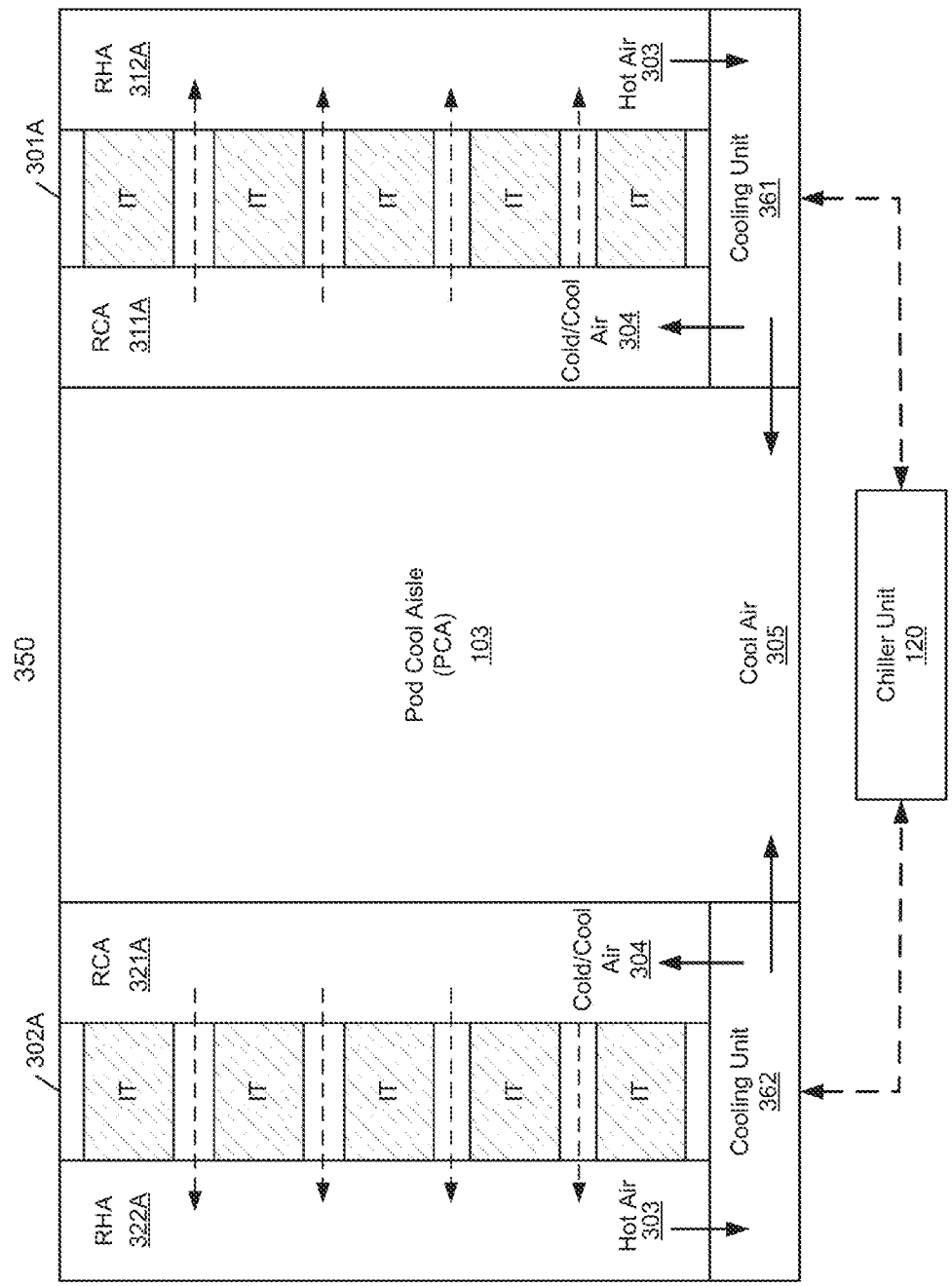

FIGS. 3A-3B are block diagrams illustrating a data center system according to another embodiment of the invention. In this example, FIG. 3A shows a top view of data center system 300, while FIG. 3B shows a side or cross view 350 of data center system 300. Data center 300 may represent data center system 100 of FIGS. 1A-1C. Referring to FIGS.

3A-3B, in this example, data center system 300 includes first row 101 of electronic racks 301A-301N (collectively referred to as electronic racks 301) and second row 102 of electronic racks 302A-302N (collectively referred to as electronic racks 302). Rows 101-102 are positioned aligned with or against the opposite inner walls of a container or housing of data center system 300. Rows 101-102 form pod aisle 103 between rows 101-102 within the container.

In one embodiment, pod aisle 103 allows an IT personnel or operator to walk into the housing to access the IT components from one side of the electronic racks, such as inspection, configuration, repairs, or any other management operations. An IT personnel can also access the IT components from the other side of the electronic racks via an exterior wall of the container of data center system 300. As described above, an electronic rack includes a front panel and a back panel as part of a corresponding rack enclosure or housing that encloses the IT components therein. The front panel and the back panel operate as a panel door or window for access, which may be controlled (e.g., opened or closed) by a controller or by an IT personnel manually.

According to one embodiment, data center system 300 further includes at least one cooling unit (e.g., cooling units 361 and 362 as shown in FIG. 3B) that includes at least one heat exchanger configured to provide cool air to exchange heat generated by electronic racks 301-302. The cooling unit may be disposed at a position that is lower than the position at which electronic racks 301-302 are disposed. As a result, if there is a leakage from the cooling unit, the IT components stored within electronic racks 301-302 would not be significantly damaged due to the leakage.

According to one embodiment, each of electronic racks 301-302 includes a stack of IT components. The stack of IT components is positioned within a corresponding rack housing (also referred to as rack container, rack enclosure). For example, the rack housing may include a stack of electronic component shelves or slots (e.g., horizontal slots) to allow an individual IT component to be inserted into or removed from the shelf. The stack of IT components is positioned in a manner, such that an airspace between the rack housing and the stack of IT components forms a RCA (e.g., a first rack aisle) and a RHA (e.g., a second rack aisle).

Referring to FIGS. 3A-3B, according to one embodiment, an RCA of each of electronic racks 301-302 is formed and positioned at a near side with respect to pod aisle 103 (e.g., adjacent to pod aisle 103). An RHA of each of electronic racks 301-302 is formed and positioned at a far side from pod aisle 103 (e.g., adjacent to the wall of the container, away from pod aisle 103). In one embodiment, an RCA (e.g., RCAs 311A and 321A) is configured to direct cool air 304 generated from a cooling unit upwardly. Cool air 304 may then be directed flowing across (e.g., horizontally) the air space between IT components within the corresponding electronic rack outwardly with respect to pod aisle 103, for example, using one or more fans mounted on a side of the IT components (e.g., fans 215 of FIG. 2A). Cool air 304 exchanges the heat generated from the IT components and transforms into hot or warm air 303 to reach an RHA. In one embodiment, an RHA (e.g., RHAs 312A and 322A) is configured to direct hot air 303 to the cooling unit downwardly to allow the cooling unit (e.g., cooling units 361-362) to recycle the hot air back to cool air.

In one embodiment, each of electronic racks 301-302 is associated with or includes an individual cooling unit positioned underneath or below the corresponding stack of IT components. The individual cooling unit operates independently with respect to other cooling units of other electronic racks. One of the advantages in this configuration is that each electronic rack becomes an independent modular unit that can inserted and removed (e.g., together with the corresponding cooling unit) from the data center system without affecting other electronic racks. In the event that any malfunction occurs within one electronic rack, the malfunctioning electronic rack can be individually shut down and replaced. For example, if an individual cooling unit of a particular electronic rack leaks, such a leakage would not cause significant damage to other electronic racks due to liquid damage or overheat because of malfunctioned individual cooling unit. Similarly, an individual cooling unit can also be individually replaced, for example, without having to remove or replace the associated electronic rack.

Another advantage is that the liquid flow volume or speed can be independently controlled by a controller (not shown) based on the operating temperature of the corresponding electronic rack, which may be monitored by one or more sensors (not shown). Each electronic rack may operate under a different condition or operating environment (e.g., workload, or number of active IT components) and thus, it may operate with a different operating temperature. As a result, the work load and/or power of the cooling unit and/or the corresponding chiller system can be balanced or reduced. In one embodiment, the flow control of liquid can be performed on a per electronic rack basis, a per row basis, a per data center unit basis, or a combination thereof.

Alternatively according to another embodiment, each of rows 101-102 is associated with one or more cooling units that provide cool air to all electronic racks of the corresponding row. That is, one or more cooling units may be shared by the entire row of electronic racks. Furthermore, both rows 101-102 may share one or more cooling units. A combination of the above configurations may be implemented dependent upon the specific requirement of a data center (e.g., cost benefit). For example, a data center having multiple data center systems or units may include a first data center system with an individual cooling unit for each electronic rack. The data center may further include a second data center system with one or more cooling units shared by each row of electronic racks. The data center may further include a third data center system with one or more cooling units shared by both rows of electronic racks, etc.

Further, even within a data center system, one row can be configured to have an individual cooling unit for each electronic racks, while the other row has one or more cooling units shared by all electronic racks of the same row. Similarly, even within the same row, some of the electronic racks may share one or more cooling units, while other electronic racks may have an individual or designated cooling unit. Such configurations may be configured statically or on demand, for example, using programmable controllers, switches, and/or controllable valves. Other configurations may also be applied.

A heat exchanger of a cooling unit (e.g., cooling units 361-362) is a device used to transfer heat between one or more fluids or liquid. The fluids may be separated by a solid wall to prevent mixing or they may be in direct contact. For efficiency, heat exchangers are designed to maximize the surface area of the wall between the fluids, while minimizing resistance to fluid flowing through the exchanger. The exchanger's performance can also be affected by the addition of fins or corrugations in one or both directions, which increase a surface area and may channel fluid flow or induce turbulence. Similar to an air conditioning system, a chiller system such as chiller system 120 is a machine that removes heat from a liquid via a vapor-compression or absorption refrigeration cycle. This liquid can then be circulated through a heat exchanger to cool air. Dependent upon the specific requirement of cool air, a control system (not shown) may be configured to control or adjust cool air with desired temperature and/or moisture.

Referring back to FIGS. 3A-3B, according to one embodiment, a cooling unit generates and directs a first portion 304 (e.g., approximately 85-90 percent) of the cool air into an RCA, while it directs a second portion 305 (e.g., approximately 10-15 percent) of the cool air into pod aisle 103. As a result, the overall temperature within pod aisle 103 is lower than the temperature within an RHA in generate. The temperature of pod aisle 103 may be similar to slightly lower than the temperature of an RCA. For the purpose of illustration only, pod aisle 103 is also referred to as pod cool aisle (PCA) since it has a cooler temperature than an RHA. The cooler air in PCA 103 may be utilized to cool the IT components of an electronic rack when a corresponding cooling unit malfunctions or fails to provide adequate cool air.

Figure 4A:
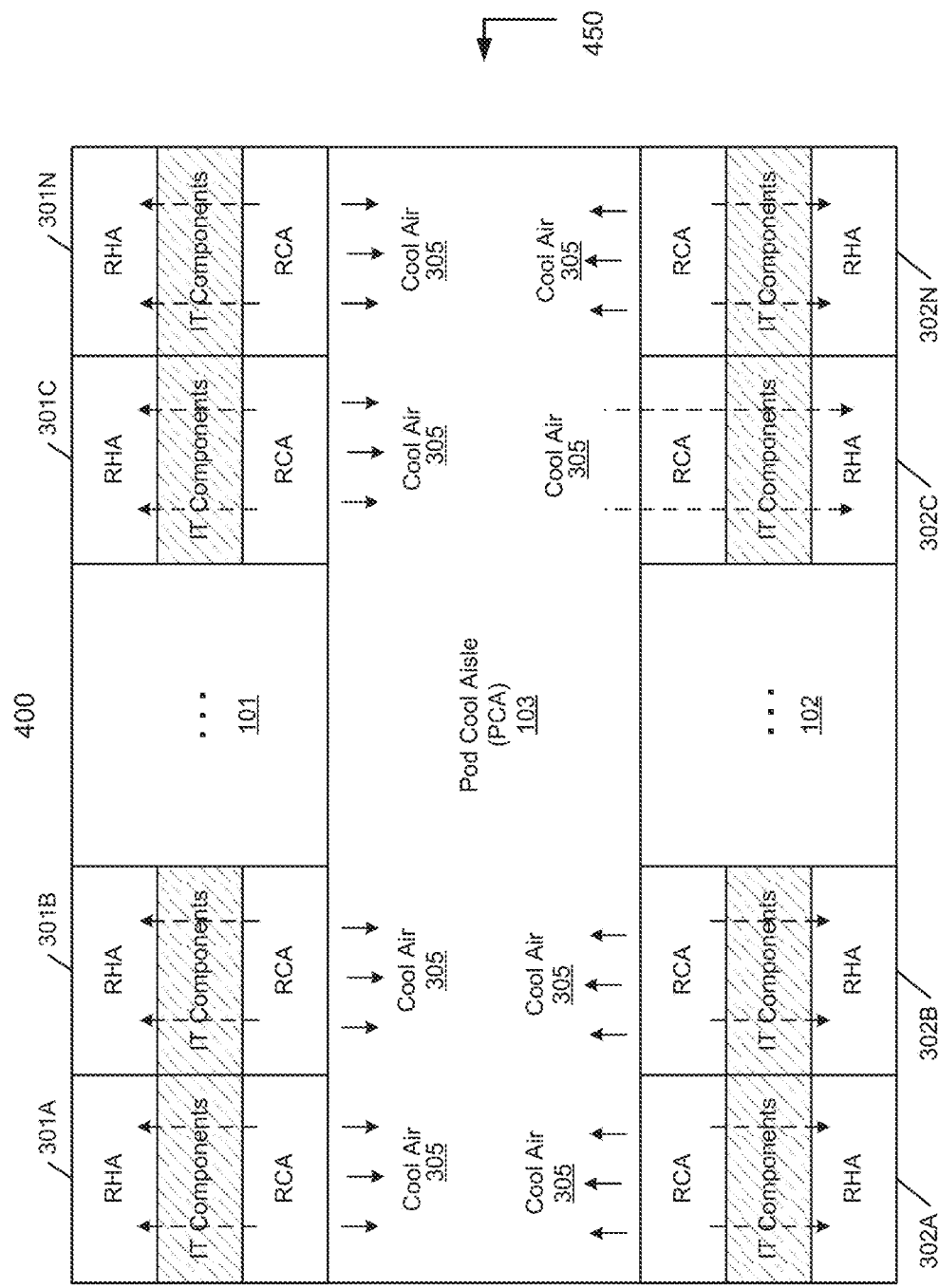
FIGS. 4A-4B are block diagrams illustrating a data center system according to another embodiment of the invention.
Figure 4B:
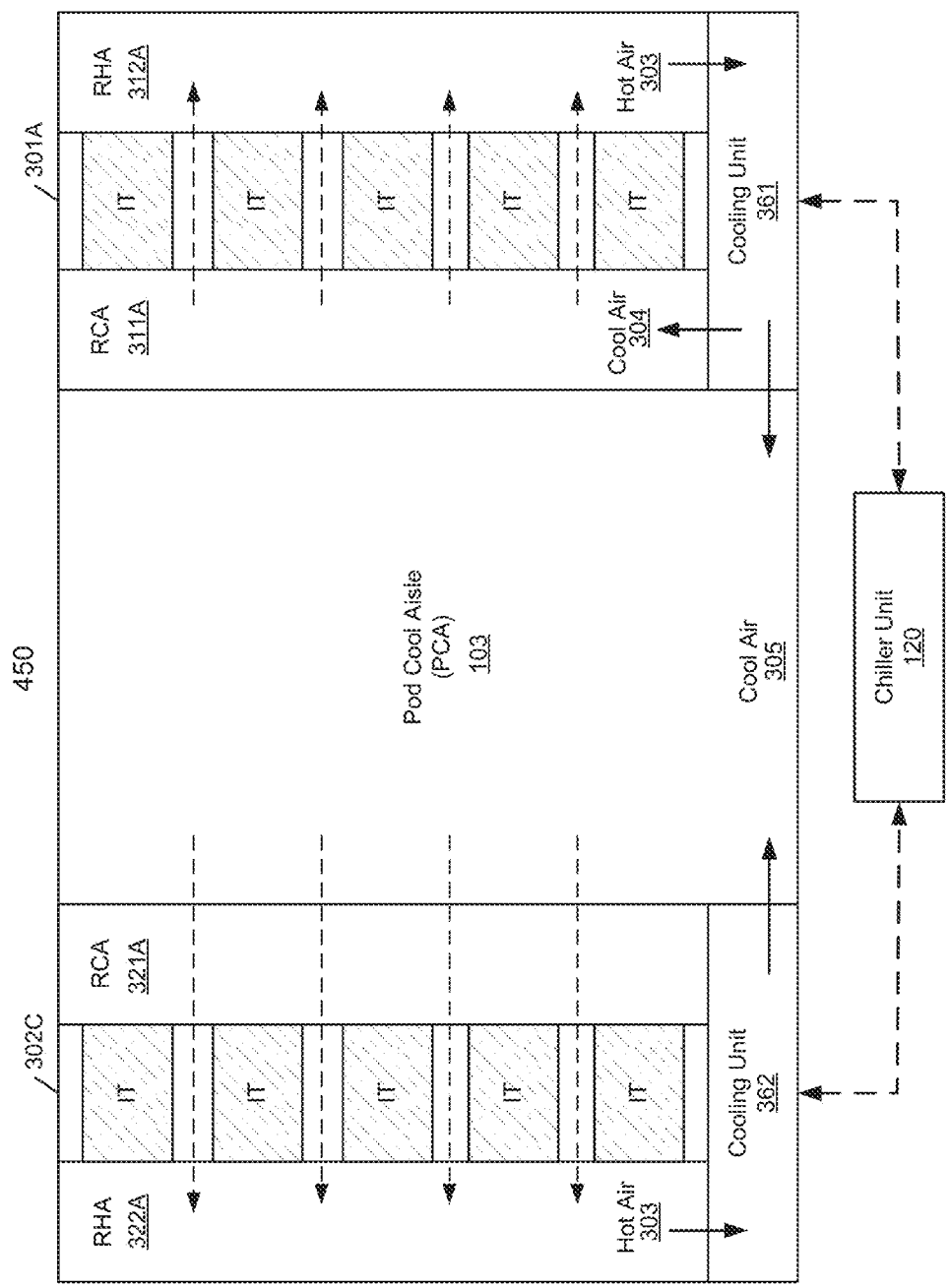

FIGS. 4A-4B are block diagrams illustrating a data center system according to another embodiment of the invention. In this example, similar to FIGS. 3A-3B, FIG. 4A shows a top view of data center system 400, while FIG. 4B shows a side or cross view 450 of data center system 400. Data center 400 may represent any of the data center systems as described above. Referring to FIGS. 4A-4B, as described above, some of the cool air generated by one or more cooling units may be directed or provided to PCA 103 as part of cool air 305.

For the purpose of illustration, it is assumed that a cooling unit associated with electronic rack 302C fails to provide adequate cool air to cool the IT components contained within electronic rack 302C. In one embodiment, such a failure can be detected based on the temperature detected by one or more sensors or detectors deployed at various locations of electronic rack 302C (not shown). For example, when a temperature of electronic rack 302C exceeds a predetermined threshold, it can be inferred that the corresponding cooling unit fails to provide adequate cool air. Alternatively, a detector may detect there is a leakage of the corresponding cooling unit as a sign of malfunction of the cooling unit.

According to one embodiment, in response to such a detection, a controller (not shown) is configured to unlock and open one or more windows or openings, or the entire panel door on the interior side of electronic rack 302C (e.g., the back panel or inner panel adjacent to PCA 103) to allow the cooler air 305 of PCA 103 to enter electronic rack 302C to cool the IT components of electronic rack 302C. That is, the cool air flowing through the airspace of IT components of electronic rack 302C is drawn from cool air 305 of PCA 103, instead of or additionally from cooling unit 362 associated with electronic rack 302C.

In one embodiment, there may be a magnetic switching mechanism deployed on a window or panel door of each electronic rack that is controlled by a controller. In response to a detection of a failed cooling unit received from a sensor or detector, the controller sends a signal to the magnetic switching mechanism to unlock the window or door, which causes the window or door to be opened to allow cool air 305 to enter the electronic rack.

Note that in this example, cooling unit 362 associated with electronic rack 302C does not have to stop providing cool air in order to allow cool air 305 to enter electronic rack 302C. Rather, as long as it is detected that there is insufficient cool air to be circulated within electronic rack 302C (e.g., a temperature below a predetermined threshold or liquid leakage), its window or panel door can be unlocked and opened to allow additional cool air 305 to enter electronic rack 302C. This configuration can be applied to a scenario in which the IT components of a particular electronic rack cause a higher operating temperature, for example, due to an unusually high workload/demand or processing power/resources.

Meanwhile cool air 305 is continuously provided by other cooling units associated with other electronic racks. As a result, the IT components of electronic rack 302C can at least be temporarily cooled to reduce the probability of overheating, while waiting for a replacement of the corresponding failed cooling unit or the entire electronic rack. The data services provided to the clients would not be significantly interrupted or disturbed.

Figure 5A:
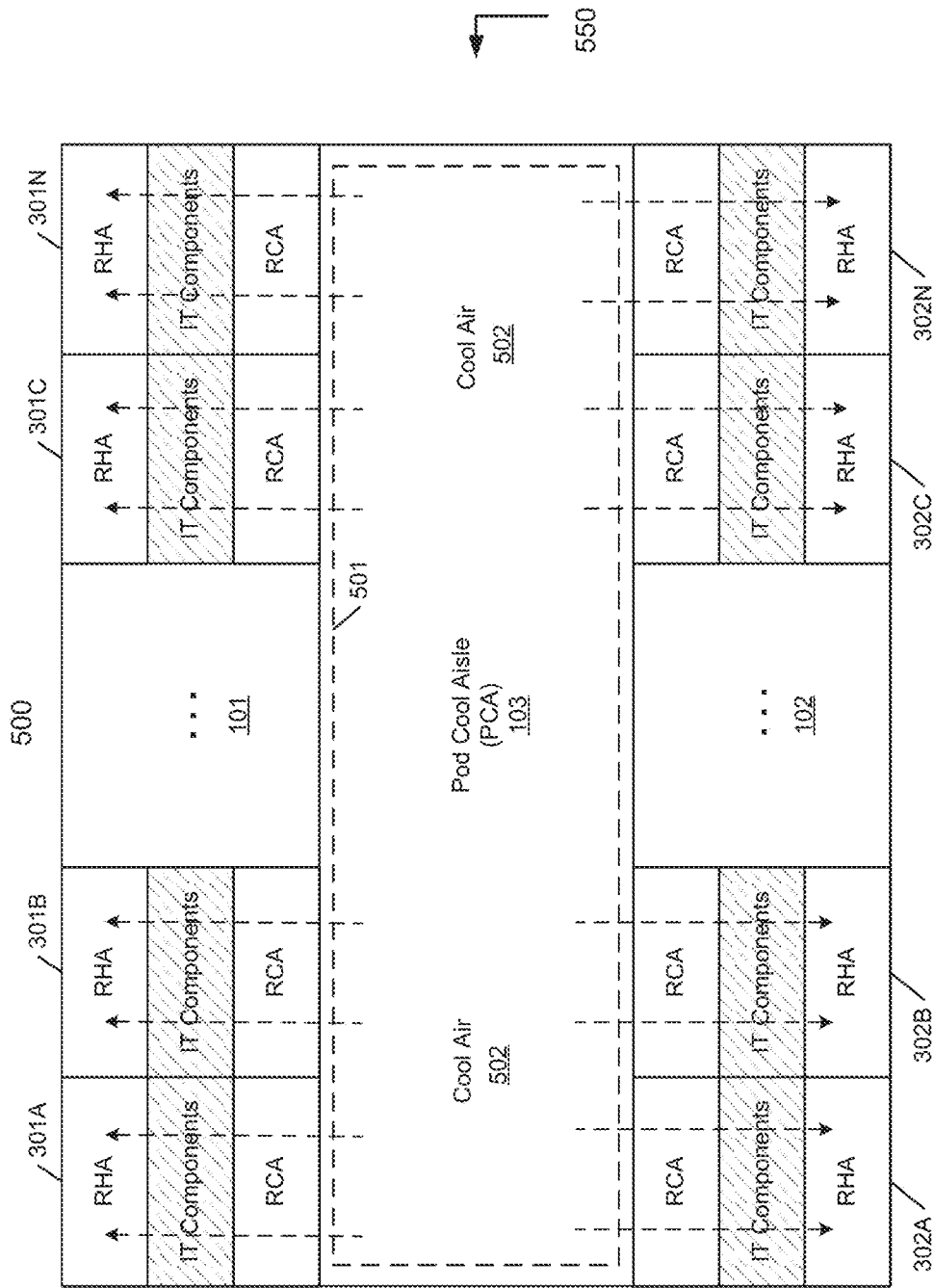
FIGS. 5A-5B are block diagrams illustrating a data center system according to another embodiment of the invention.
Figure 5B:
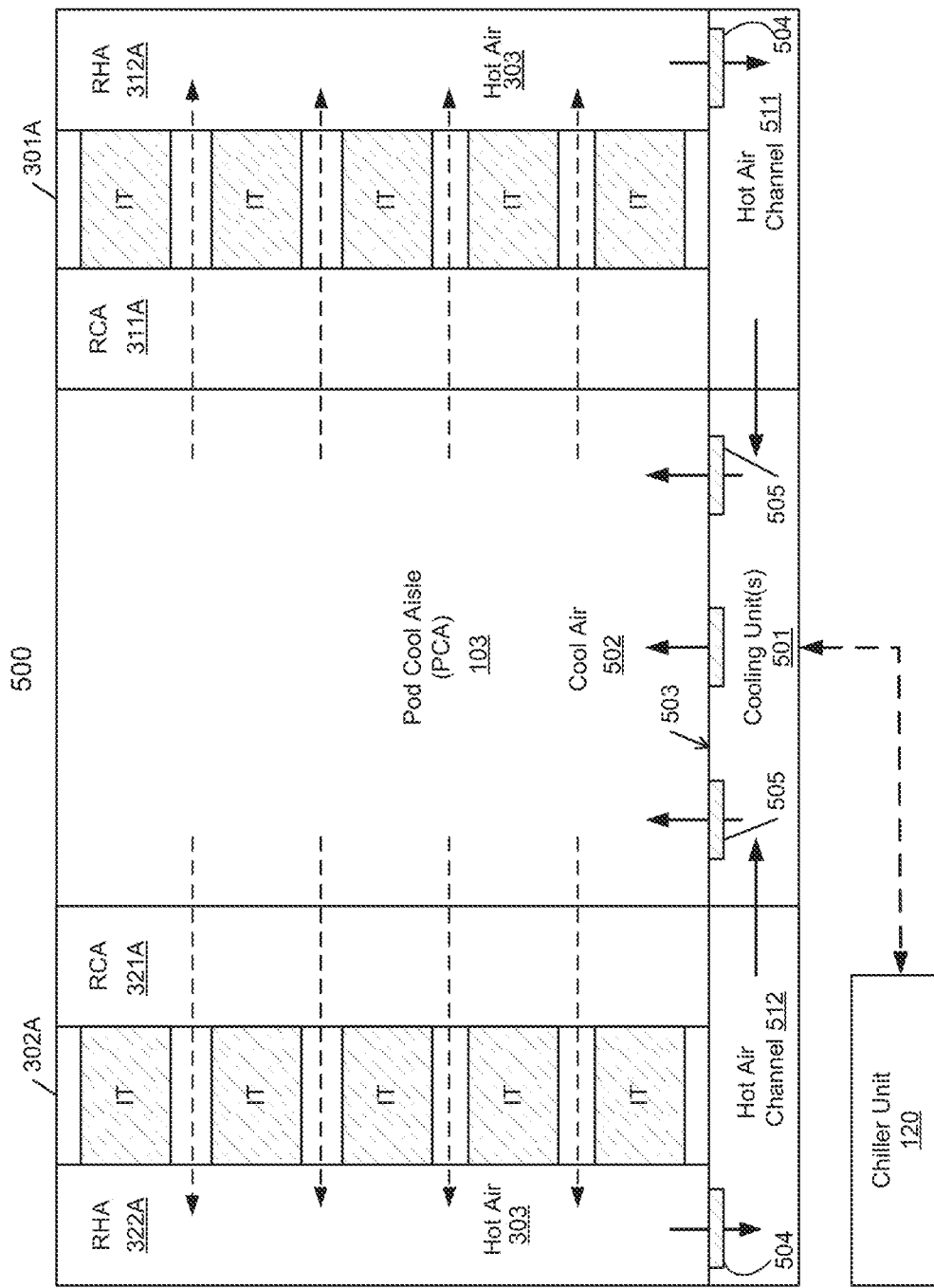

FIGS. 5A-5B are block diagrams illustrating an example of a data center system according to a further embodiment of the invention. Data center system 500 may be implemented as part of data center system 100 as shown in FIGS. 1A-1C. In this example, FIG. 5A is shown as a top view while FIG. 5B is shown as a cross view of a data center system. Referring to FIGS. 5A-5B, data center system 500 includes a floor platform that is raised from the ground, referred to herein as a raised floor 503. All of the electronic racks, in this example, electronic racks 301-302 of rows 101-102, are disposed or positioned on the raised floor 503. Data center system 500 includes one or more cooling units 501 positioned underneath raised floor 503 and below PCA 103. The centrally located cooling unit(s) 501 may be configured to provide cool air 502 to be supplied to both rows 101-102 of electronic racks 301-302.

In one embodiment, the space between raised floor 503 and the ground floor forms hot air channels or tunnels 511-512. In addition, raised floor 503 includes an array of outlet ports 505 disposed within the area of PCA 103 and an array of inlet ports 504 disposed within the areas of the RHAs, in this example, RHA 312A and 322A. There may be one or more fans or air propellers mounted within a proximity of outlet ports 505 to push or force cool air 502 generated from cooling unit 501 upwardly into PCA vie outlet ports 505 disposed on raised floor 503. Cool air 502 is then directed outwardly into electronic racks 301-302 of rows 101-102. Cool air 502 flows across the airspace between the IT components of rows 101-102 for the purpose of heat exchange, which transforms cool air 502 into hot air 303 within the RHAs. Hot air 303 is then directed downwardly within the RHAs and into hot air channels 511-512 via the corresponding inlet ports 504 to return to cooling unit 501.

Figure 6:
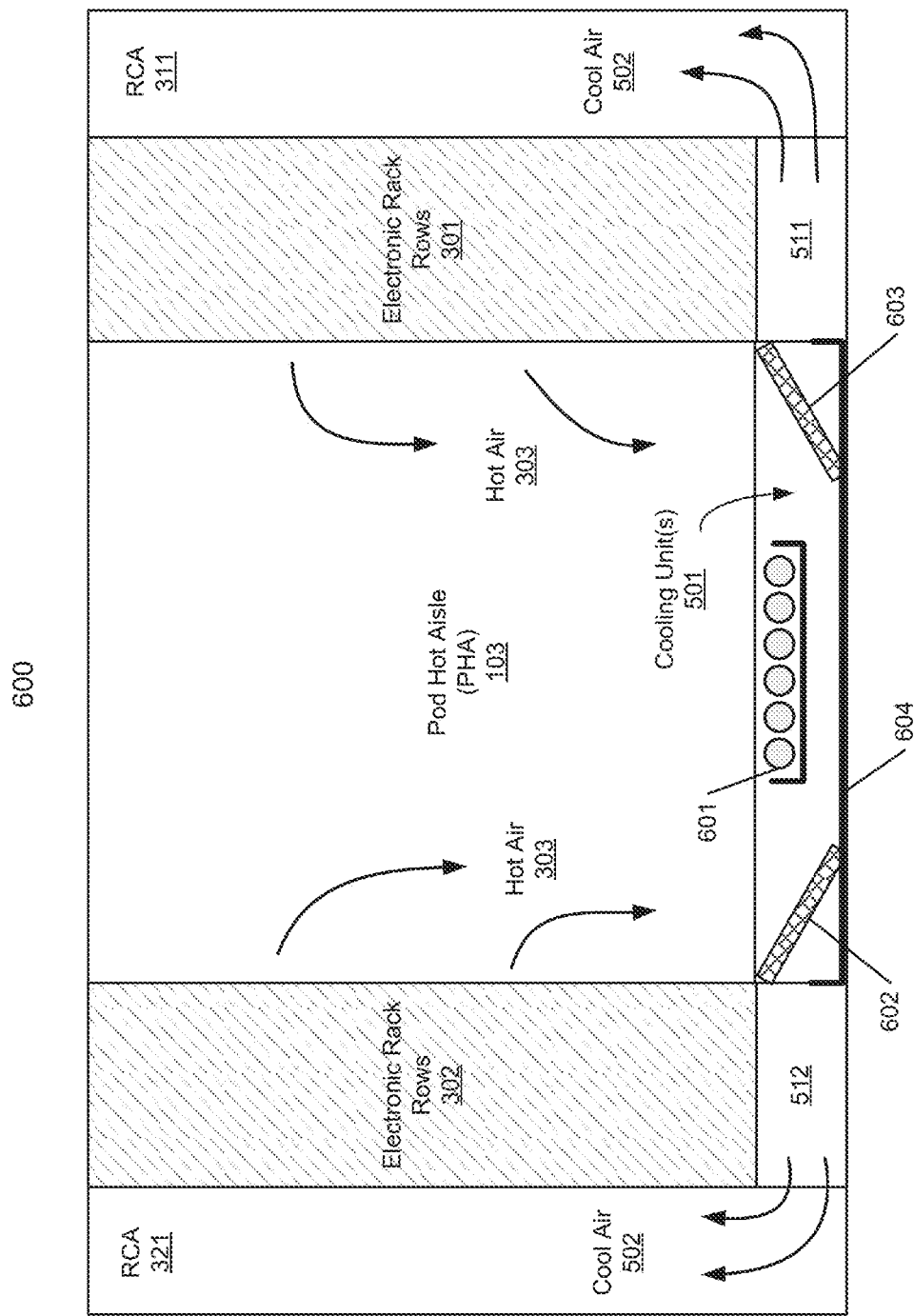
FIG. 6 is a block diagram illustrating a data center system according to another embodiment of the invention.

FIG. 6 is a block diagram illustrating a data center system according to another embodiment of the invention. System 600 represents an alternative design with respect to FIGS. 5A-5B. Referring to FIG. 6, the design is similar to the design as shown in FIGS. 5A-5B, except that the air flow is configured to flow an opposite direction as of FIGS. 5A-5B. In this embodiment, cooling unit 501 generates cool air that will flow upwardly into RCS 311 and 321, where pod aisle 103 becomes a pod hot aisle (PHA). The cool air travels inwardly from RCAs 311 and 321 through the air space between the IT components of electronic racks 301-302. Cooling unit 501 has the same or similar structure as of FIGS. 5A-5B.

In one embodiment, cooling unit 501 includes one or more heat exchangers 602-603 that can be individually plugged or removed for replacement purpose. In addition, cooling unit 501 includes a coolant distribution system 601 to distribute the coolant to cool the hot air received from PHA 103. Cooling unit 501 further includes liquid containment unit 604 to contain or collect any potential liquid that may be leaked from heat exchangers 602-603, such that the leaked liquid would not damage the IT components in the electronic racks 301-302.

Figure 7A:
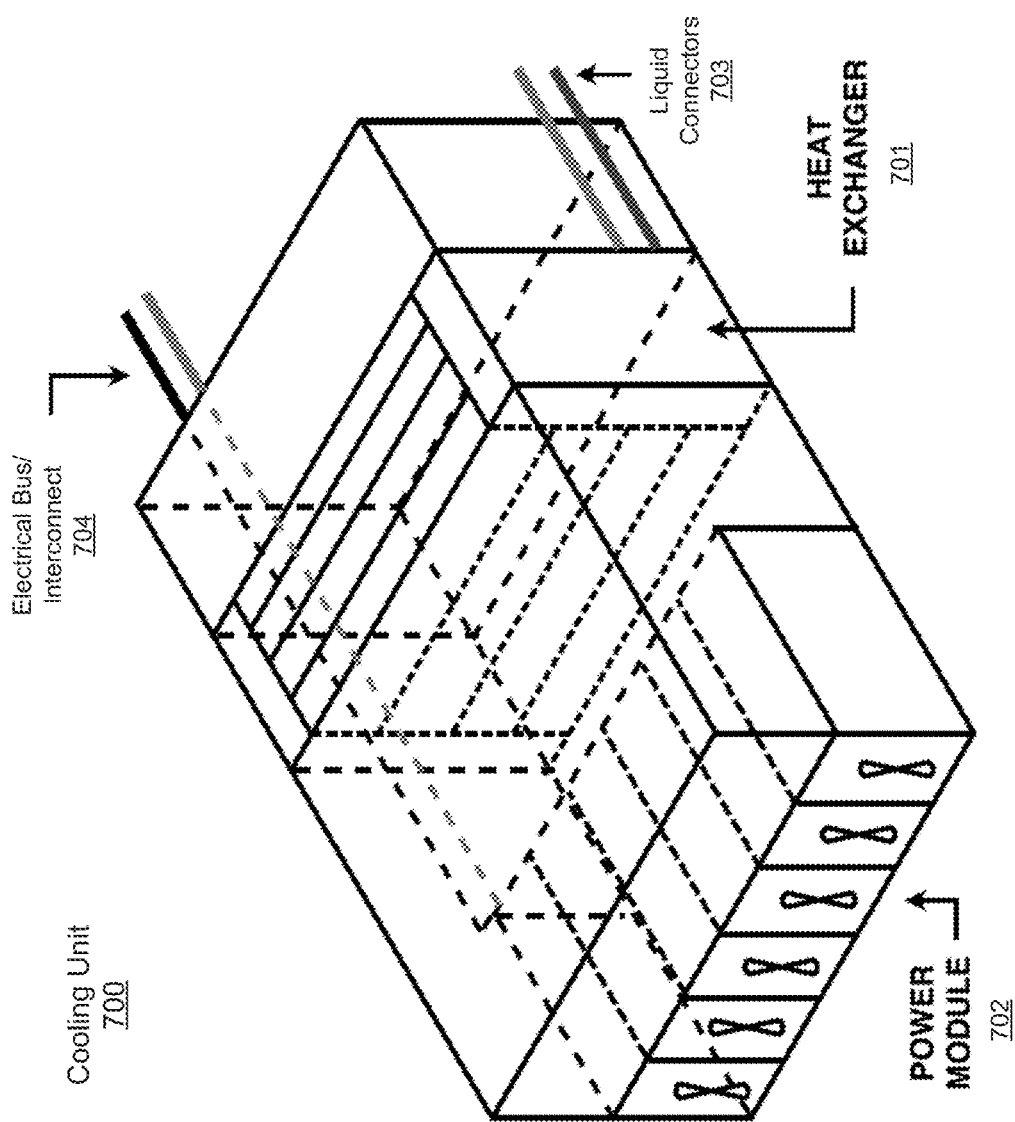
FIGS. 7A and 7B are block diagrams illustrating an example of a cooling unit according to one embodiment of the invention.
Figure 7B:
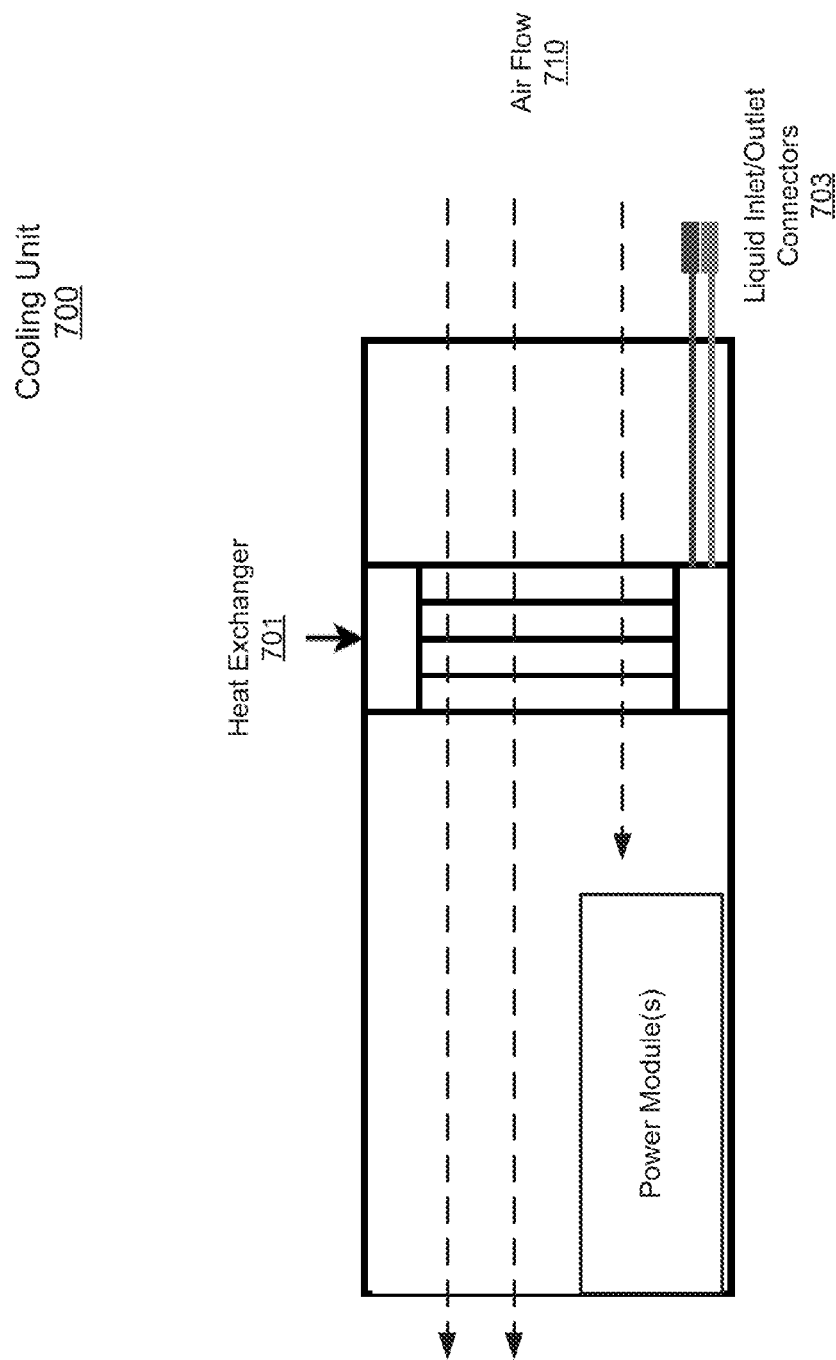

FIGS. 7A and 7B are block diagrams illustrating an example of a cooling unit according to one embodiment of the invention. Referring to FIGS. 7A-7B, cooling unit 700 represents any of the cooling units described above, such as cooling units 210 and 361-362. In this embodiment, cooling unit 700 (also referred to as a cooling module) includes one or more heat exchangers 701 and one or more power modules 702. Power modules 702 are configured to provide power to IT components of an electronic rack via power bus or interconnect 704. Heat exchangers 701 are coupled to a pair of liquid supply lines via liquid connectors 703, including an inlet connector to receive cool/cold liquid from an inlet liquid supply line from a chiller system or a central distribution unit (CDU) and an outlet connector to transmit warm/hot liquid to the chiller system or the CDU. In one embodiment, power modules 702 only occupy a portion of air space within a housing of cooling unit 700 to allow air flow 710 to flow through and also provide cooling to power modules 702 as shown in FIG. 7B. Cooling unit 700 may further include one or more fans (not shown) to propel the air flow for heat exchange.

In one embodiment, cooling unit 700 is configured to be a modular or portable unit that can be swapped in and out from a shelf or slot within an electronic rack, also referred to as a cooling slot. The power connectors 704 and liquid connectors 703 can be hot swappable to allow cooling unit 700 to be individually replaced and/or repaired. Cooling unit 700 can be inserted into any of the suitable slots within an electronic rack, as long as a proper liquid containment mechanism is configured to prevent any potential liquid leaks from damaging the IT components. One or more of cooling unit 700 can be placed anywhere within an electronic rack, dependent upon the specific configuration or demand. Further, heat exchange(s) 701 can also be individually swappable from cooling unit 700 via connectors 703.

Figure 8:
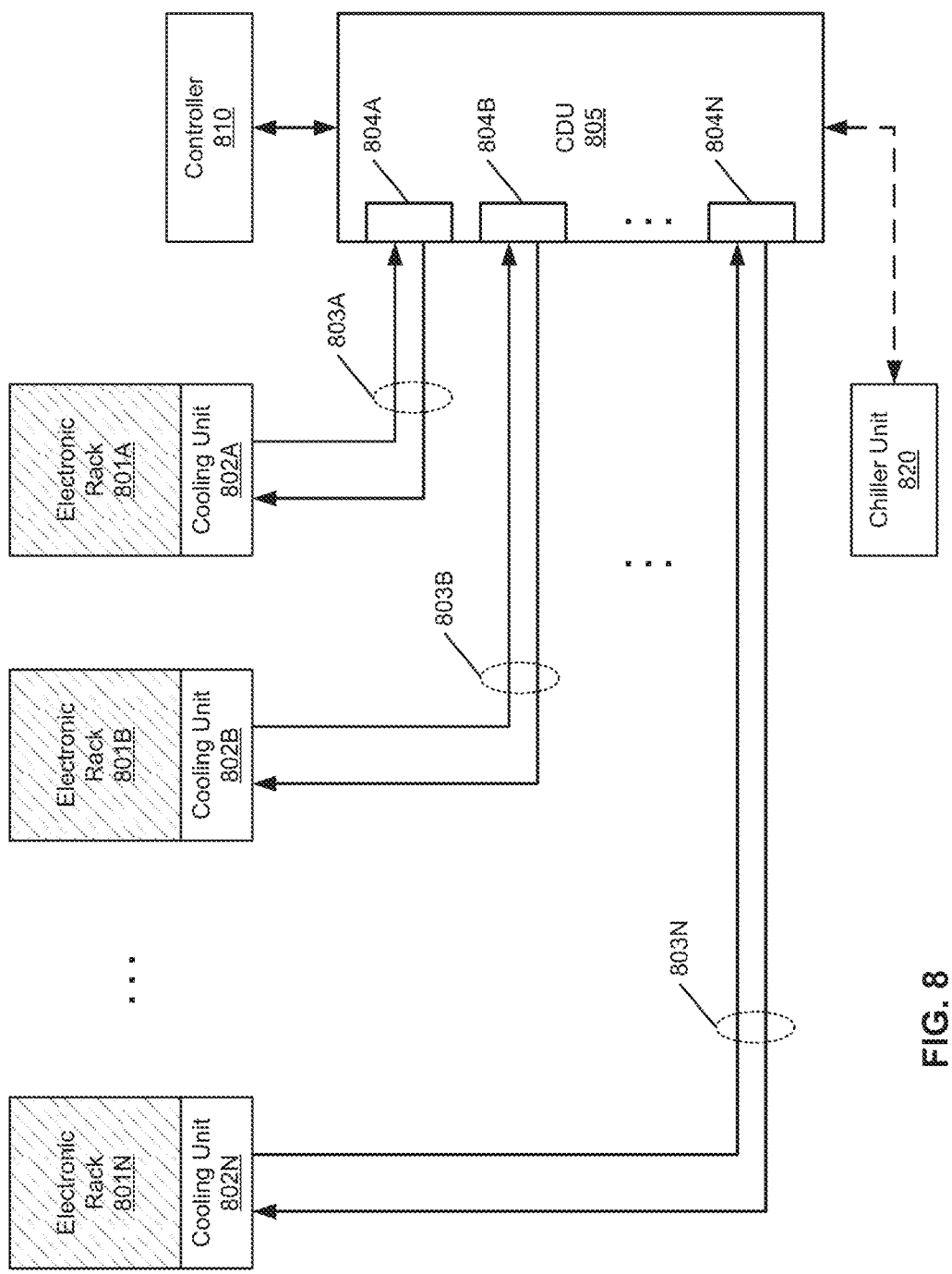
FIG. 8 is a block diagram illustrating a data center system according to another embodiment of the invention.

FIG. 8 is a block diagram illustrating a data center system according to another embodiment of the invention. Data center system 800 may represent any of the data center systems described above. Referring to FIG. 8, system 800 includes an array of electronic racks 801-801 (collectively referred to as electronic racks 801), which may represent any of the electronic racks described above. Electronic racks are coupled to central distribution unit (CDU) 805 via a respective pair of liquid supply lines 803A-803N (collectively referred to as liquid supply lines 803). Each of electronic racks 801 includes or is associated with one of cooling units 802A-802N (collectively referred to as cooling units 802). Although only one cooling unit is shown, however, multiple cool units can be implemented within an electronic rack.

As described above, each of cooling units 802 includes at least one heat exchanger, also referred to as a local heat exchanger as it is located locally with respect to the associated IT components within an electronic rack. The local heat exchangers are coupled to one of heat exchangers 804A-804N of CDU 805 (collectively referred to as centralized heat exchangers 804) via liquid supply lines 803, respectively. Each of the local heat exchangers of cooling units 802 is a liquid-air heat exchanger to exchange heat from hot air received from the IT components with cool/cold liquid received from CDU 805. Each of centralized heat exchangers 804 is a liquid-liquid heat exchanger to exchange heat from warm/hot liquid received from a corresponding one of cooling units 802 with cool/cold liquid received from chiller unit 820.

In one embodiment, data center system 800 is further associated with or includes controller 810 to control (e.g., turning on/off, liquid flow rate) the operations of heat exchangers 804 and/or the heat exchangers within cooling units 802. Controller 810 may be implemented as part of CDU 805. Controller 810 can individually control the operations of heat exchangers 804 and/or the heat exchangers of cooling units 802. As described above, each of cooling units 802 can be individually swappable for replacement or repair. When any one of the cooling units 802 breaks down, the cooling unit can be individually shut off and disconnected from the respective pair of liquid supply lines 803 without impacting the remaining cooling units and their respective pairs of liquid supply lines. For example, before an old unit is taken offline, the liquid has to be flushed out from the lines. When a new cooling unit or local heat exchanger is connected, an individual test/purge operation can be performed on the corresponding liquid supply lines, while the remaining cooling units continue working without interruption. For example, additional air bubbles have to be flushed out before turning on a new cooling unit and/or a local heat exchanger. Similarly, centralized heat exchangers 804 can also be individually replaced. Note that CDU 805 may be implemented within a housing of data center system 800 or external to data center 800. CDU 805 may also be shared by multiple data center systems.

Note that the cooling techniques described above can be applied to a variety of different types of data centers, such as, for example, traditional colocation data centers and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data center system, comprising:
   a container to contain a plurality of electronic racks of information technology (IT) components operating therein; and
   a cooling unit having one or more cooling modules disposed underneath the electronic racks of the IT components to receive first liquid from a chiller unit, to exchange heat generated from the IT components using the first liquid, to transform the first liquid into a second liquid with a higher temperature, and to transmit the second liquid carrying the exchanged heat back to the chiller unit,
   wherein each of the electronic racks comprises
      a housing to house one or more of the IT components arranged in a stack,
      a first rack aisle formed on a first side of the one or more IT components to direct cool air received from the cooling unit upwardly, and
      a second rack aisle formed on a second side of the one or more IT components to direct hot air to the cooling unit downwardly, the hot air being transformed from the cool air from the first rack aisle by flowing through an air space between the one or more IT components.

2. The data center system of claim 1, wherein the electronic racks are arranged in a first row aligned with a first wall of the container and a second row aligned with a second wall of the container, forming a pod aisle between the first row and the second row.

3. The data center system of claim 2, wherein the cooling unit comprises:
   a first cooling module having a first heat exchanger disposed underneath the first row of electronic racks to provide cool air to IT components of electronic racks of the first row; and
   a second cooling module having a second heat exchanger disposed underneath the second row of electronic racks to provide cool air to IT components of electronic racks of the second row.

4. The data center system of claim 2, wherein the cooling unit generates a first portion of cool air directed into the housing and a second portion of cool air directed into the pod aisle.

5. The data center system of claim 2, wherein the cooling unit comprises a plurality of individual cooling modules, and wherein each individual cooling module is disposed at a bottom of one of the electronic racks, respectively.

6. The data center system of claim 5, further comprising:
   a detector to detect that a first individual cooling module associated with a first electronic rack malfunctions; and
   a controller coupled to the detector to open at least one window on a housing of the first electronic rack to draw cooler air from the pod aisle into the housing to cool IT components of the first electronic rack.

7. The data center system of claim 6, wherein the detector is configured to detect leakage of the first individual cooling module as a sign of a malfunction.

8. The data center system of claim 6, wherein the controller comprises a magnetic mechanism to unlock the at least one window.

9. The data center system of claim 5, further comprising:
   one or more sensors disposed at one or more locations within a first electronic rack to determine an operating temperature within the first electronic rack; and
   a controller coupled to the sensors to control a flow volume of liquid flowing within a first individual cooling module associated with the first electronic rack based on the operating temperature.

10. The data center system of claim 5, wherein each electronic rack further comprises a cooling slot to allow a corresponding individual cooling module to be inserted into and removed from the cooling slot without having to disturb operations of corresponding IT components.

11. The data center system of claim 5, wherein each of the individual cooling modules includes a heat exchanger and a power module, wherein the power module is to provide power to corresponding IT components, and wherein the heat exchanger further provides cooling air to cool the power module.

12. The data center system of claim 11, wherein the power module occupies a portion of airspace within the cooling module without significantly blocking cool air from flowing from a first side of the cooling module to a second side of the cooling module to provide the cool air to corresponding IT components.

13. The data center system of claim 1, wherein each electronic rack further comprises one or more fans mounted on a side of the one or more IT components to force the cool air flowing from the first rack aisle to the second rack aisle.

14. A data center system, comprising:
   a container to contain a plurality of electronic racks of information technology (IT) components operating therein, wherein the electronic racks are arranged in a first row and a second row to form a pod aisle between the first row and the second row; and
   a cooling unit having one or more heat exchangers disposed underneath the pod aisle, wherein the cooling unit is configured to receive cool liquid from a chiller unit, to exchange heat generated from the IT components using the cool liquid, which transforms the cool liquid into warm liquid, and to transmit the warm liquid carrying the exchanged heat back to the chiller unit,
   wherein each of the electronic racks of the first row and the second row comprises
      a housing to house one or more of the IT components arranged in a stack,
      a rack cool aisle (RCA) formed on a first side of the one or more IT components to receive the cool air from the cooling unit, and
      a rack hot aisle (RHA) formed on a second side of the one or more IT components to direct hot air to the cooling unit, wherein the hot air is transformed from the cool air from the RCA by flowing through an air space between the one or more IT components.

15. The data center system of claim 14, wherein the first row and the second row of electronic racks are disposed on a raised floor, wherein the cooling unit is disposed below the raised floor and underneath the pod aisle.

16. The data center system of claim 15, wherein the cooling unit generates the cool air that is directed upwardly into the pod aisle above the raised floor, and wherein the cool air is drawn into the electronic racks outwardly from the pod aisle above the raised floor.

17. The data center system of claim 15, wherein the raised floor comprises a plurality of outlet ports disposed within the pod aisle to allow the cool air entering the pod aisle upwardly, and wherein the raised floor comprises a plurality of inlet ports disposed to allow the hot air to reach the cooling unit from a plurality of RHAs of the electronic racks.

18. The data center system of claim 15, wherein the cooling unit generates the cool air that is directed upwardly into the RCA of each electronic rack above the raised floor, and wherein the cool air is drawn into the electronic racks inwardly from the RCA above the raised floor.

19. The data center system of claim 15, wherein the raised floor comprises a plurality of outlet ports disposed within RCAs of the electronic racks to allow the cool air entering the RCAs upwardly, and wherein the raised floor comprises a plurality of inlet ports disposed within the pod aisle to allow the hot air to reach the cooling unit from a plurality of RHAs of the electronic racks.

20. The data center system of claim 14, wherein each of the heat exchangers can be individually replaced without interrupting operations of remaining heat exchangers of the cooling unit.

21. The data center system of claim 14, wherein the cooling unit further comprises a liquid containment unit to contain liquid potentially leaked from the heat exchangers.

22. A data center system, comprising:
a plurality of electronic racks, wherein each of the electronic racks comprises
one or more information technology (IT) components operating therein, and
a cooling unit having a local heat exchanger disposed underneath the IT components to receive cold liquid to exchange heat generated from the IT components using the cold liquid to reduce a temperature of the IT components; and
a central distribution unit coupled to the plurality of electronic racks, wherein central distribution unit comprises
a plurality of centralized heat exchangers, wherein each of the centralized heat exchangers is coupled to one of the local heat exchangers of the plurality of electronic racks, and
a plurality of pairs of liquid supply lines to exchange heat between the local heat exchangers and the centralized heat exchanger, wherein each pair of the liquid supply lines couples one of the centralized heat exchangers to a corresponding one of the local heat exchangers of the electronic racks.

23. The data center system of claim 22, wherein each of the local heat exchangers is a liquid-air heat exchanger to exchange heat from hot air generated by the IT components with cool liquid received via a corresponding pair of liquid supply lines.

24. The data center system of claim 22, wherein each of the centralized heat exchangers is a liquid-liquid heat exchanger to exchange heat exchanged from a corresponding local heat exchanger and carried by warm liquid with cold liquid received from a chiller unit.

25. The data center system of claim 22, wherein each of the local heat exchangers can be individually replaced by decoupling from a corresponding pair of liquid supply lines without affecting operations of remaining local heat exchangers.

26. The data center system of claim 22, wherein each of the centralized heat exchangers can be individually replaced by decoupling from a corresponding pair of liquid supply lines without affecting operations of remaining centralized heat exchangers.

27. The data center system of claim 22, wherein each of the electronic racks further comprises:
a housing to house the IT components arranged in a stack;
a first rack aisle formed on a first side of the one or more IT components to direct cool air received from the cooling unit upwardly; and
a second rack aisle formed on a second side of the one or more IT components to direct hot air to the cooling unit downwardly, the hot air being transformed from the cool air from the first rack aisle by flowing through an air space between the one or more IT components.

* * * * *